United States Patent
Lee et al.

(10) Patent No.: US 11,264,251 B2
(45) Date of Patent: Mar. 1, 2022

(54) METHOD OF MANUFACTURING POWER AMPLIFIER PACKAGE EMBEDDED WITH INPUT-OUTPUT CIRCUIT

(71) Applicant: WAVEPIA CO., LTD., Gyeonggi-do (KR)

(72) Inventors: Sang-Hun Lee, Gyeonggi-do (KR); Kue-Jin Han, Gyeonggi-do (KR)

(73) Assignee: WAVEPIA CO., LTD.

(*) Notice: Subject to any disclaimer, the term of this patent is extended or adjusted under 35 U.S.C. 154(b) by 0 days.

(21) Appl. No.: 16/766,483

(22) PCT Filed: Nov. 29, 2018

(86) PCT No.: PCT/KR2018/014926
§ 371 (c)(1),
(2) Date: May 22, 2020

(87) PCT Pub. No.: WO2020/111321
PCT Pub. Date: Jun. 4, 2020

(65) Prior Publication Data
US 2021/0013050 A1    Jan. 14, 2021

(30) Foreign Application Priority Data
Nov. 29, 2018   (KR) .......................... 10-2018-0150331

(51) Int. Cl.
*H01L 21/48*   (2006.01)
*H01L 23/498*  (2006.01)
(Continued)

(52) U.S. Cl.
CPC ...... *H01L 21/4839* (2013.01); *H01L 21/4828* (2013.01); *H01L 23/49861* (2013.01);
(Continued)

(58) Field of Classification Search
CPC ............ H01L 21/4839; H01L 21/4828; H01L 23/49861; H01L 23/66; H01L 2223/6655;
(Continued)

(56) References Cited

U.S. PATENT DOCUMENTS 5,258,575 A  *  11/1993  Beppu ................... H01L 23/057
                                                        174/557
5,920,116 A  *   7/1999  Umehara .......... H01L 23/49503
                                                        257/669
(Continued)

FOREIGN PATENT DOCUMENTS

KR          101666745          12/2016

*Primary Examiner* — Duy T Nguyen
(74) *Attorney, Agent, or Firm* — IPLA P.A.

(57) ABSTRACT

A method of manufacturing a power amplifier package embedded with an input-output circuit including a dielectric circuit board, a heat sink and lead frames, the method comprising: the step of preparing the dielectric circuit board including the steps of forming a power amplifier hole in which a power amplifier chip is to be disposed on a dielectric substrate, printing an input matching network metal pattern on a left side of the power amplifier hole, and printing an output matching network metal pattern on a right side of the power amplifier hole, and sintering the input matching network metal pattern and the output matching network metal pattern printed on the dielectric substrate; the step of preparing the lead frames by etching alloy 42 and plating nickel; and the step of attaching the heat sink on a bottom surface of the dielectric circuit board.

10 Claims, 3 Drawing Sheets

(51) Int. Cl.
*H01L 23/66* (2006.01)
*H03F 3/195* (2006.01)

(52) U.S. Cl.
CPC ............ *H01L 23/66* (2013.01); *H03F 3/195* (2013.01); *H01L 2223/6655* (2013.01)

(58) Field of Classification Search
CPC ......... H01L 23/49811; H01L 23/49866; H01L 23/13; H01L 23/00; H01L 23/14; H01L 23/15; H01L 23/40; H01L 23/552; H01L 23/142; H03F 3/195
USPC .......................................................... 438/106
See application file for complete search history.

(56) References Cited

U.S. PATENT DOCUMENTS

| | | | | |
|---|---|---|---|---|
| 6,829,148 | B2* | 12/2004 | Nelson ................. | H05K 1/0243 361/760 |
| 6,982,879 | B1* | 1/2006 | Franca-Neto ........ | H01Q 9/0407 343/700 MS |
| 7,722,962 | B2* | 5/2010 | Soga .................... | H05K 3/3478 428/620 |
| 7,911,271 | B1* | 3/2011 | Jia ......................... | H01L 23/66 330/67 |
| 8,110,932 | B2* | 2/2012 | Sjoestroem ............ | H01L 24/49 257/784 |
| 8,736,034 | B2* | 5/2014 | Montoriol, Jr. ... | H01L 23/49531 257/666 |
| 9,721,902 | B2* | 8/2017 | Jiang ..................... | H01L 23/36 |
| 10,504,748 | B2* | 12/2019 | Lee ....................... | H01L 21/481 |
| 2002/0064903 | A1* | 5/2002 | Kawata ................. | H01L 24/05 438/107 |
| 2003/0051340 | A1* | 3/2003 | Nelson ................. | H05K 9/0039 29/846 |
| 2004/0007384 | A1* | 1/2004 | Soga .................... | H05K 3/3485 174/260 |
| 2004/0150489 | A1* | 8/2004 | Driver .................... | H03F 1/56 333/32 |
| 2005/0013989 | A1* | 1/2005 | Hirose ............. | H01L 23/49883 428/323 |
| 2005/0151238 | A1* | 7/2005 | Yamunan ............ | H01L 23/4951 257/696 |
| 2006/0139903 | A1* | 6/2006 | Takagi .................... | H01L 23/50 361/764 |
| 2007/0175660 | A1* | 8/2007 | Yeung .................... | H01L 24/49 174/521 |
| 2007/0243409 | A1* | 10/2007 | Terao .................... | B28B 3/206 428/689 |
| 2007/0268073 | A1* | 11/2007 | Suzaki .................... | H03F 1/56 330/295 |
| 2008/0142935 | A1* | 6/2008 | Montoriol ......... | H01L 23/49531 257/666 |
| 2009/0096068 | A1* | 4/2009 | Sjoestroem ............ | H01L 23/66 257/666 |
| 2010/0091477 | A1* | 4/2010 | Takagi .................... | H01L 24/49 361/820 |
| 2012/0247821 | A1* | 10/2012 | Nomura ............... | H05K 1/0287 174/258 |
| 2014/0252570 | A1* | 9/2014 | Montoriol ......... | H01L 23/49575 257/664 |
| 2015/0303134 | A1* | 10/2015 | Mak ...................... | H01L 24/83 438/112 |
| 2016/0065144 | A1* | 3/2016 | Jiang ..................... | H01L 23/36 330/289 |
| 2017/0162656 | A1* | 6/2017 | Stamper ................ | H01L 29/267 |
| 2020/0366259 | A1* | 11/2020 | Sun .................... | H01L 23/49562 |

* cited by examiner

METHOD OF MANUFACTURING POWER AMPLIFIER PACKAGE EMBEDDED WITH INPUT-OUTPUT CIRCUIT

BACKGROUND

The present invention relates to a method of manufacturing a power amplifier package embedded with an input-output circuit, and more specifically, to a method of manufacturing a power amplifier package embedded with an input-output circuit capable of disposing a dielectric substrate and lead frames on the same plane by embedding an integrated input-output circuit in the dielectric substrate and disposing a power amplifier on the same plane as that of the input-output circuit described above.

Due to the proliferation of ICT (Information and Communications Technologies) technology, various activities that have been performed in outdoor spaces are gradually progressed indoors. Therefore, the proportion of the indoor spaces in everyday life is gradually increasing, and services provided for outdoor spaces, such as navigation and the like, are gradually expanding targeting the indoor spaces.

RF (Radio Frequency) products providing high-performance are proposed to satisfy the demand for the services, and power amplifiers of high-power and high-efficiency are essential to implement the high-performance RF products.

Conventionally, as the power amplifiers of high-power and high-efficiency described above are configured by stacking a dielectric circuit board and a dielectric package, they have a problem in that the process of manufacturing the power amplifiers is complicated, and the manufacturing cost is increased.

The background art of the present invention is disclosed in Korea Patent Registration No. 10-1686745.

SUMMARY OF THE INVENTION

Therefore, the present invention has been made in view of the above problems, and it is an object of the present invention to provide a method of manufacturing a power amplifier package embedded with an input-output circuit capable of disposing a dielectric substrate and lead frames on the same plane by embedding an integrated input-output circuit in the dielectric substrate and disposing a power amplifier on the same plane as that of the input-output circuit described above.

The object of the present invention is not limited to the object mentioned above, and unmentioned other objects may be clearly understood by those skilled in the art from the following descriptions.

To accomplish the above object, a method of manufacturing a power amplifier package embedded with an input-output circuit according to an embodiment of the present invention comprises: the step of preparing the dielectric circuit board including the steps of forming a power amplifier hole in which a power amplifier chip is to be disposed on a dielectric substrate, printing an input matching network metal pattern on the left side of the power amplifier hole, and printing an output matching network metal pattern on the right side of the power amplifier hole, and sintering the input matching network metal pattern and the output matching network metal pattern printed on the dielectric substrate; the step of preparing the lead frames by etching alloy 42 and plating nickel; and the step of attaching the heat sink on the bottom surface of the dielectric circuit board, attaching the lead frames to the input matching network metal pattern and the output matching network metal pattern of the dielectric circuit board, and plating the input matching network metal pattern and the output matching network metal pattern of the dielectric circuit board and the lead frames with nickel or gold.

In the method of manufacturing a power amplifier package embedded with an input-output circuit according to an embodiment of the present invention, at the step of preparing the dielectric circuit board, the dielectric substrate is an alumina ($Al_2O_3$) ceramic substrate.

In the method of manufacturing a power amplifier package embedded with an input-output circuit according to an embodiment of the present invention, at the step of preparing the dielectric circuit board, the input matching network metal pattern and the output matching network metal pattern are printed using tungsten (W) or molybdenum manganese alloy (MoMn).

In the method of manufacturing a power amplifier package embedded with an input-output circuit according to an embodiment of the present invention, at the step of preparing the dielectric circuit board, the input matching network metal pattern and the output matching network metal pattern printed on the dielectric substrate are sintered in an electric furnace at 1250° C. to 1500° C.

In the method of manufacturing a power amplifier package embedded with an input-output circuit according to an embodiment of the present invention, at the step of preparing the dielectric circuit board, the input matching network metal pattern and the output matching network metal pattern are surface-treated with nickel, palladium or gold, after the input matching network metal pattern and the output matching network metal pattern are printed.

DETAILED DESCRIPTION OF THE PREFERRED EMBODIMENT

Figure 1:
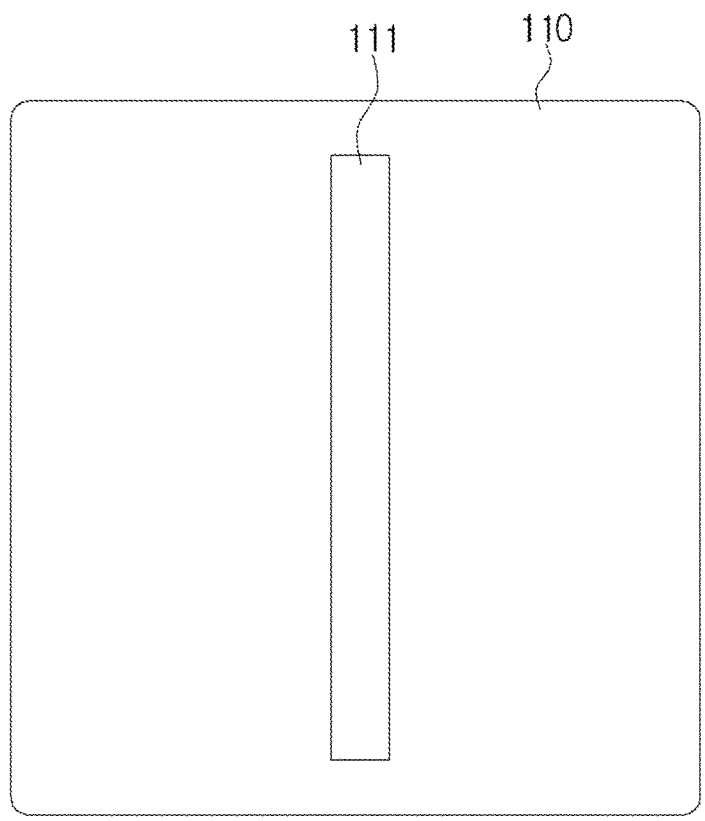
FIG. 1 is a view showing a dielectric substrate of a method of manufacturing a power amplifier package embedded with an input-output circuit according to an embodiment of the present invention.

The detailed description of the present invention will be described below with reference to the accompanying drawings which show specific embodiments that the present invention can be embodied as an example. The embodiments are described in detail to be sufficient for those skilled in the art to embody the present invention. It should be understood that although the diverse embodiments of the present invention are different from each other, they do not need to be mutually exclusive. For example, specific shapes, structures and features described herein may be implemented as another embodiment without departing from the spirit and scope of the present invention in relation to an embodiment. In addition, it should be understood that the locations or arrangements of individual components in each disclosed embodiment may be changed without departing from the spirit and scope of the present invention.

Therefore, it is not intended to take the detailed description described below in a limited sense, and if appropriately explained, the scope of the present invention is limited only by the attached claims, together with all the scopes equivalent to the claims. Like reference numerals in the drawings denote like or similar functions throughout several aspects, and the length, area, thickness and the like and the shape may be exaggerated for convenience.

Figure 2:
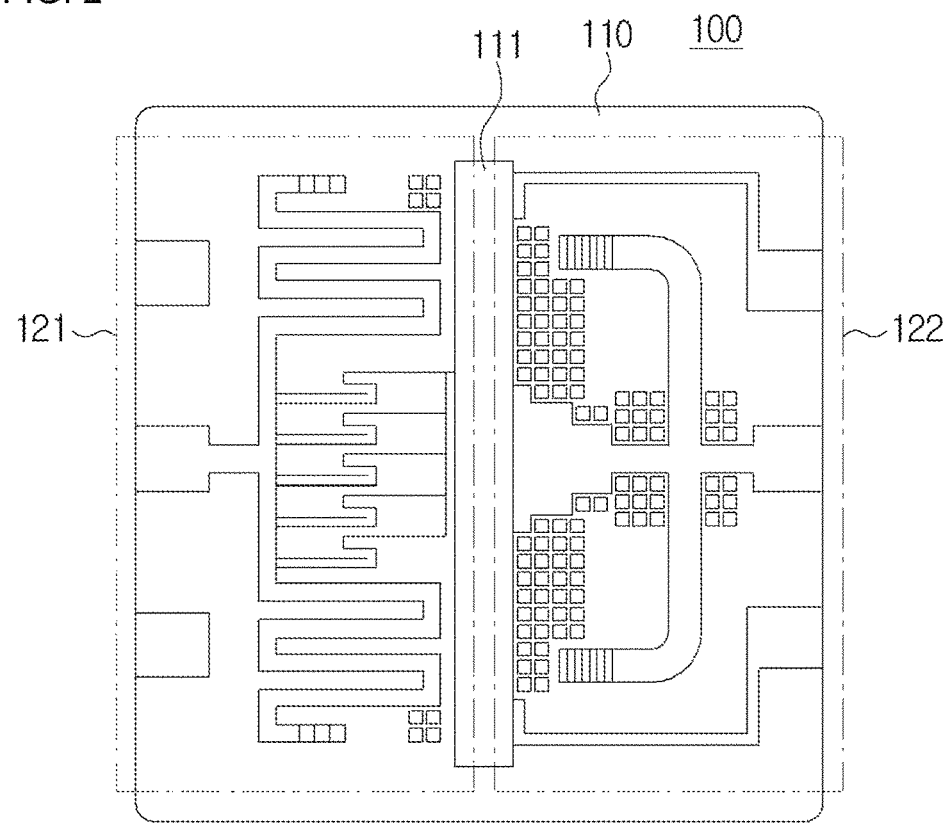
FIG. 2 is a view showing a dielectric circuit board of a method of manufacturing a power amplifier package embedded with an input-output circuit according to an embodiment of the present invention.
Figure 3:
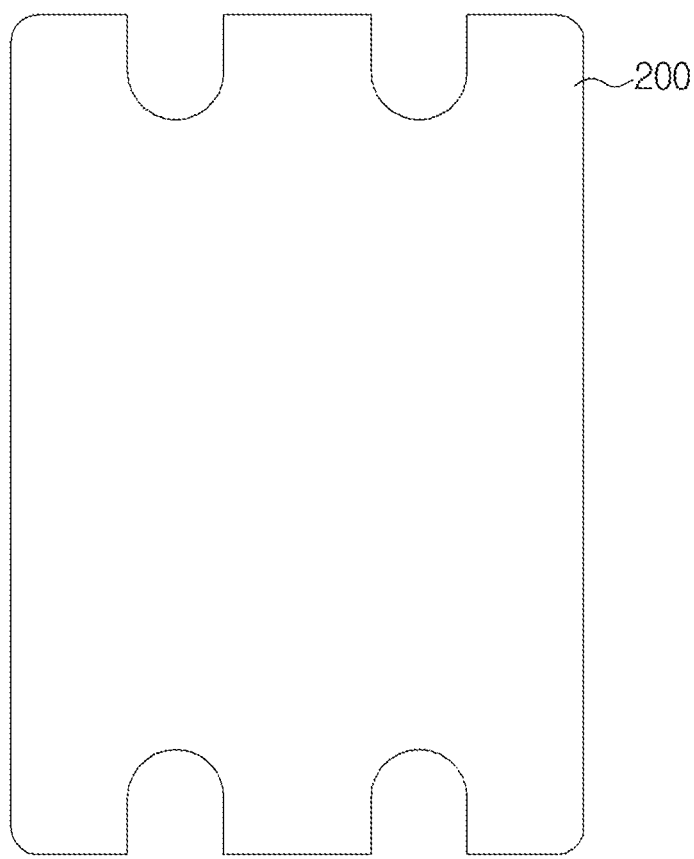
FIG. 3 is a view showing a heat sink of a method of manufacturing a power amplifier package embedded with an input-output circuit according to an embodiment of the present invention.
Figure 4:
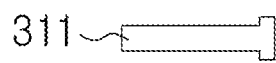
FIG. 4 is a view showing lead frames of a method of manufacturing a power amplifier package embedded with an input-output circuit according to an embodiment of the present invention.
Figure 4:
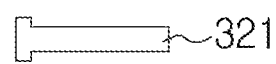
Figure 4:
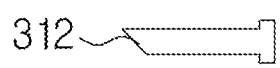
Figure 4:
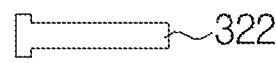
Figure 4:
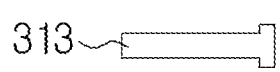
Figure 4:
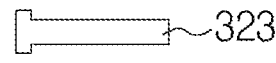
Figure 5:
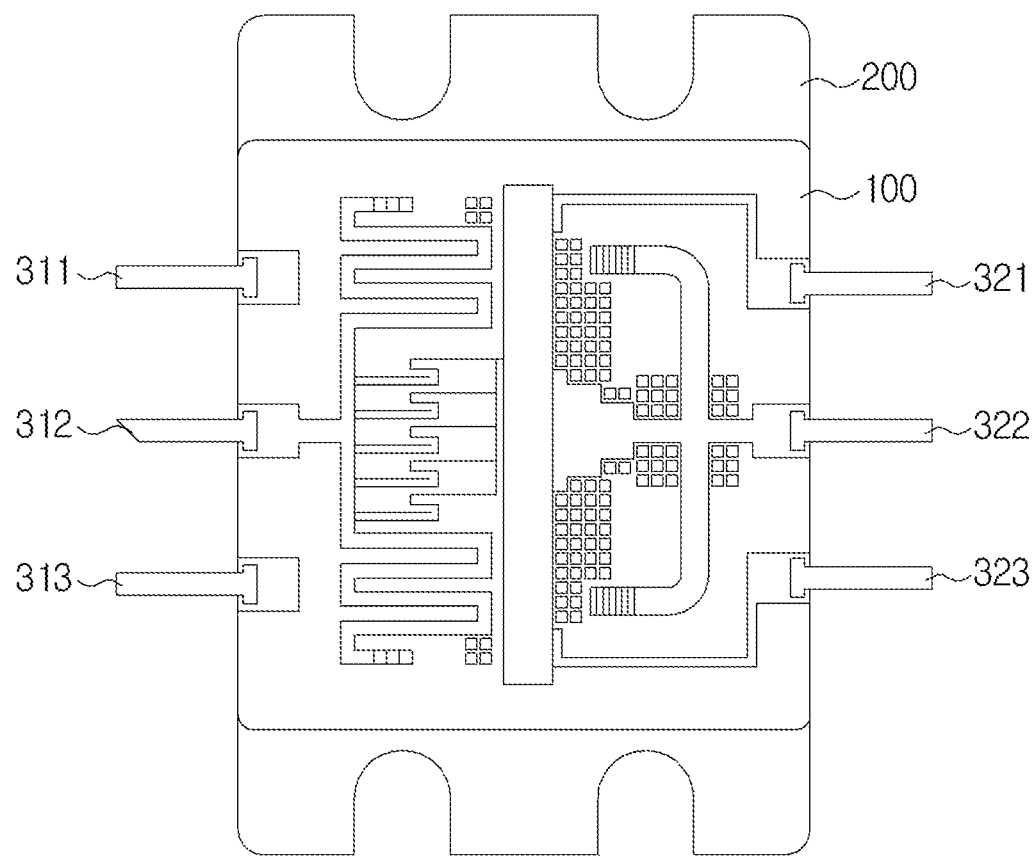
FIG. 5 is a view showing a power amplifier package embedded with an input-output circuit, completed in a method of manufacturing a power amplifier package embedded with an input-output circuit according to an embodiment of the present invention.

FIG. 1 is a view showing a dielectric substrate of a method of manufacturing a power amplifier package embedded with an input-output circuit according to an embodiment of the present invention, FIG. 2 is a view showing a dielectric circuit board of a method of manufacturing a power amplifier package embedded with an input-output circuit according to an embodiment of the present invention, FIG. 3 is a view showing a heat sink of a method of manufacturing a power amplifier package embedded with an input-output circuit according to an embodiment of the present invention, FIG. 4 is a view showing lead frames of a method of manufacturing a power amplifier package embedded with an input-output circuit according to an embodiment of the present invention, and FIG. 5 is a view showing a power amplifier package embedded with an input-output circuit, completed in a method of manufacturing a power amplifier package embedded with an input-output circuit according to an embodiment of the present invention.

A power amplifier package embedded with an input-output circuit, which is manufactured in a method of manufacturing a power amplifier package embedded with an input-output circuit according to an embodiment of the present invention, may be configured to include, as shown in FIG. 5, a dielectric circuit board 100, a heat sink 200, and lead frames 311, 312, 313, 321, 322 and 323.

First, as shown in FIG. 1, a power amplifier hole 111 in which a power amplifier chip is to be disposed on a dielectric substrate 110 is formed through a laser cutting process. Here, the dielectric substrate 110 may be an alumina ($Al_2O_3$) ceramic substrate.

Next, as shown in FIG. 2, an input matching network metal pattern 121 is printed on the left side of the power amplifier hole 111 and an output matching network metal pattern 122 is printed on the right side of the power amplifier hole 111 in a screen printing process or a laser printing process. Here, the input matching network metal pattern 121 is for matching input impedance, and the output matching network metal pattern 122 is for matching output impedance.

Meanwhile, the input matching network metal pattern 121 and the output matching network metal pattern 122 may be printed using tungsten (W) or molybdenum manganese alloy (MoMn).

Thereafter, the input matching network metal pattern 121 and the output matching network metal pattern 122 may be surface-treated with nickel, palladium or gold.

Next, the input matching network metal pattern 121 and the output matching network metal pattern 122 printed on the dielectric substrate 110 are sintered. Specifically, the input matching network metal pattern 121 and the output matching network metal pattern 122 printed on the dielectric substrate 110 are sintered in an electric furnace at 1250° C. to 1500° C.

Next, as shown in FIG. 4, the lead frames 311, 312, 313, 321, 322 and 323 are prepared by etching the alloy 42 and plating nickel.

Next, as shown in FIG. 5, the heat sink 200 of FIG. 3 is attached on the bottom surface of the dielectric circuit board 100 through a brazing process.

Next, as shown in FIG. 5, the lead frames 311, 312, 313, 321, 322 and 323 are attached to the input matching network metal pattern 121 and the output matching network metal pattern 122 of the dielectric circuit board 100 through a brazing process.

Next, the input matching network metal pattern 121 and the output matching network metal pattern 122 of the dielectric circuit board 100 and the lead frames 311, 312, 313, 321, 322 and 323 are plated with nickel or gold.

As the method of manufacturing a power amplifier package embedded with an input-output circuit according to an embodiment of the present invention may embed an integrated input-output circuit in a dielectric substrate, and dispose the dielectric substrate and the lead frames on the same plane, the manufacturing process is efficient, and the manufacturing cost can be reduced effectively.

Although the present invention has been described and shown in relation to the preferred embodiments for illustrating the principle of the present invention, the present invention is not limited to the configuration and operation as is shown and described.

Rather, those skilled in the art may fully understand that the present invention can be diversely changed and modified without departing from the spirit and scope of the appended claims.

What is claimed is:

1. A method of manufacturing a power amplifier package embedded with an input-output circuit including a dielectric circuit board, a heat sink and lead frames, the method comprising:
   the step of preparing the dielectric circuit board including the steps of forming a power amplifier hole on a dielectric substrate, printing an input matching network metal pattern on a left side of the power amplifier hole, and printing an output matching network metal pattern on a right side of the power amplifier hole, and sintering the input matching network metal pattern and the output matching network metal pattern printed on the dielectric substrate;
   the step of preparing the lead frames by etching alloy 42 and plating nickel; and
   the step of attaching the heat sink on a bottom surface of the dielectric circuit board, attaching the lead frames to the input matching network metal pattern and the output matching network metal pattern of the dielectric circuit board, and plating the input matching network metal pattern and the output matching network metal pattern of the dielectric circuit board and the lead frames with nickel or gold.

2. The method according to claim 1, wherein at the step of preparing the dielectric circuit board, the dielectric substrate is an alumina ($Al_2O_3$) ceramic substrate.

3. The method according to claim 1, wherein at the step of preparing the dielectric circuit board, the input matching network metal pattern and the output matching network metal pattern are printed using tungsten (W) or molybdenum manganese alloy (MoMn).

4. The method according to claim 1, wherein at the step of preparing the dielectric circuit board, the input matching network metal pattern and the output matching network metal pattern printed on the dielectric substrate are sintered in an electric furnace at 1250° C. to 1500° C.

5. The method according to claim 1, wherein at the step of preparing the dielectric circuit board, the input matching network metal pattern and the output matching network metal pattern are surface-treated with nickel, palladium or gold, after the input matching network metal pattern and the output matching network metal pattern are printed.

6. The method according to claim 1, wherein attaching the lead frames to the input matching network metal pattern and the output matching network metal pattern of the dielectric circuit board is done such that the dielectric substrate and lead frames are disposed on the same plane.

7. The method according to claim 1, wherein attaching the lead frames to the input matching network metal pattern and the output matching network metal pattern of the dielectric circuit board is performed by a brazing process.

8. The method according to claim 7, wherein attaching the heat sink on a bottom surface of the dielectric circuit board is performed by a brazing process.

9. The method according to claim 1, wherein the input matching network metal pattern extends to a left edge of the dielectric circuit board, wherein the output matching network metal pattern extends to a right edge of the dielectric substrate.

10. The method according to claim 9, wherein attaching the lead frames to the input matching network metal pattern and the output matching network metal pattern of the dielectric circuit board is done such that the dielectric substrate and lead frames are disposed on the same plane.

* * * * *